(12) United States Patent
Kerner et al.

(10) Patent No.: US 7,684,195 B2
(45) Date of Patent: Mar. 23, 2010

(54) COOLING SYSTEM FOR ELECTRONICS HOUSING

(75) Inventors: Nikolaus Kerner, Wenzenbach (DE); Christian Weinzierl, Bogen (DE)

(73) Assignee: Siemens VDO Automotive AG, Munich (DE)

( * ) Notice: Subject to any disclaimer, the term of this patent is extended or adjusted under 35 U.S.C. 154(b) by 22 days.

(21) Appl. No.: 11/997,750

(22) PCT Filed: Jun. 21, 2006

(86) PCT No.: PCT/EP2006/063417
§ 371 (c)(1),
(2), (4) Date: Feb. 4, 2008

(87) PCT Pub. No.: WO2007/014801
PCT Pub. Date: Feb. 8, 2007

(65) Prior Publication Data
US 2008/0212281 A1    Sep. 4, 2008

(30) Foreign Application Priority Data
Aug. 2, 2005    (DE) .................. 10 2005 036 299

(51) Int. Cl.
*H05K 7/20* (2006.01)
(52) U.S. Cl. .............. 361/699; 361/707; 361/719; 361/721; 165/80.4
(58) Field of Classification Search ........... 361/699, 361/704, 707, 719, 721; 165/80.4, 104.33; 174/15.1
See application file for complete search history.

(56) References Cited

U.S. PATENT DOCUMENTS

| 4,196,775 | A |   | 4/1980  | Groh |
|---|---|---|---|---|
| 5,373,418 | A |   | 12/1994 | Hayasi |
| 5,469,331 | A | * | 11/1995 | Conway et al. ............ 361/716 |
| 5,825,621 | A | * | 10/1998 | Giannatto et al. ........... 361/701 |
| 5,829,516 | A |   | 11/1998 | Lavochkin |
| 5,966,291 | A | * | 10/1999 | Baumel et al. .............. 361/707 |
| 5,982,619 | A | * | 11/1999 | Giannatto et al. ........... 361/701 |
| 6,016,251 | A | * | 1/2000  | Koide et al. ................. 361/699 |
| 6,360,813 | B1 | * | 3/2002 | Katoh et al. ........... 165/104.33 |
| 6,621,701 | B2 | * | 9/2003 | Tamba et al. ................ 361/699 |
| 6,833,992 | B2 | * | 12/2004 | Kusaka et al. ............... 361/699 |
| 6,979,772 | B2 | * | 12/2005 | Meng-Cheng et al. .. 174/17 VA |
| 7,209,355 | B2 | * | 4/2007 | Koga et al. .................. 361/699 |
| 7,227,754 | B2 | * | 6/2007 | Griesinger et al. .......... 361/714 |
| 7,289,320 | B2 | * | 10/2007 | Chang et al. ................ 361/690 |
| 2004/0257757 | A1 |   | 12/2004 | Schweibenz et al. |

FOREIGN PATENT DOCUMENTS

DE            3522127 A1      1/1987

(Continued)

*Primary Examiner*—Boris L Chervinsky
(74) *Attorney, Agent, or Firm*—Laurence A. Greenberg; Werner H. Stemer; Ralph E. Locher

(57) ABSTRACT

A cooling system through which liquid flows for carrying away waste heat for electronics housings is particularly suited for the automotive industry. The cooling system is adapted to the dimensions of the housing. The novel device is the first to create an effective cooling system for electronics housings with and for a number of circuit board levels, yet with a space-saving compact design.

18 Claims, 2 Drawing Sheets

FOREIGN PATENT DOCUMENTS

| | | |
|---|---|---|
| DE | 69105020 T2 | 10/1991 |
| DE | 19842615 A1 | 4/1999 |
| DE | 20200484 U1 | 7/2002 |
| DE | 10317705 A1 | 10/2004 |
| DE | 10313355 A1 | 11/2004 |
| EP | 0968885 A2 | 1/2000 |
| GB | 2352092 A | 1/2001 |
| JP | 03030399 A | 2/1991 |
| WO | 0235899 A1 | 5/2002 |
| WO | 2004085209 A1 | 10/2004 |

* cited by examiner

COOLING SYSTEM FOR ELECTRONICS HOUSING

BACKGROUND OF THE INVENTION

Field of the Invention

The invention relates to a cooling system through which a liquid flows, for carrying away waste heat for electronics housings, particularly for the automotive industry.

The thermal demands imposed on electronics are becoming ever greater in the area of electronic controllers for engine management of an automobile. This can essentially be attributed to the inclusion of functions which require additional components for their implementation. The power dissipation also increases as a result of these additional components. The proximity to the engine area imposes especially high requirements on the temperature stability of the electronic control devices. This leads to the temperatures being able to exceed permitted limits in the internal connections, such as solder points for example, as well as in said components. As a result problems in relation to service life can occur.

Basically the problem of overheating is to be solved by active cooling with liquid coolers. Known concepts for liquid-cooled electronic control devices are based as a rule on additional coolers which are built onto or into the electronic unit. This makes good heat dissipation from the electronics possible.

DE 198 42 615 A1 describes an electronic device featuring a housing in which a circuit board module is accommodated. A forced cooling device with cooling fins is connected to the outer wall of the housing. The disadvantage of this solution however is that the cooling elements are not arranged in the immediate vicinity of the electronic components from which heat is emitted but somewhat to the side, which leads to an increased space requirement. In addition this cooler is not suitable for cooling electronics distributed over a number of circuit board levels, since it generally involves flat constructions. One current solution to this problem consists of using a number of coolers or specially shaped coolers, which in respect of their manufacturing or installation however, once again demand increased outlay.

BRIEF SUMMARY OF THE INVENTION

Using this solution as its starting point, the underlying object of the invention is to create a cooling system with a space-saving, compact design which guarantees secure cooling even across a number of circuit board levels.

This object is achieved by a cooling system for electronics housings with the features of claim 1. Advantageous embodiments and developments, which can be used individually or in combination, are the subject matter of the dependent claims.

The outstanding feature of the inventive cooling system is that it is adapted to the geometry of the housing. This allows a space-saving compact design for the overall electronic device since no additional space is needed for the cooling system. In addition the geometrical adaptation of the cooling system to the housing advantageously leads to cooling being applied directly to the electronic components emitting heat.

It is especially preferred for the cooling system to be arranged over a number of circuit board levels. This makes it possible for the components prone to power loss to be better distributed and for heat peaks to be avoided by applying cooling directly to the heat-emitting element.

The inventive cooling system is preferably essentially provided by a serpentine cooling tube which is formed from a pipe by simply bending it into the desired geometry. This very simple manufacturing method also allows very demanding housing geometries to be provided with an effective cooling.

Preferably a single-part cooling system is to be used since no sealing problems can arise in this way.

Advantageously the cooling system is arranged outside, i.e. on the side of the housing facing away from the printed circuit boards, so that the cooling liquid does not come into direct contact with the electronic components should a defect arise.

To guarantee an effective cooling, it is also advantageous for the inventive cooling system to be manufactured from a thermally-conducting material, such as aluminum for example.

For secure support of the inventive cooling system it is additionally advantageous for this to be disposed in a guide slot, so that a fixed positioning and thus a continuous cooling are guaranteed.

Furthermore it is advantageous for the pipe diameter of the cooling system to be embodied to vary between 4 mm and 20 mm, especially between 8 and 18 mm, and thus be able to be selected depending on the desired conditions, with the cooling system being applicable for all possible constructionally sensible diameters.

It is especially preferable for the cooling system to be manufactured from a corrosion-resistant material, since it is supported outside the housing and can thus come into contact with salt spray mist, water or other, in some cases chemically aggressive, substances such as alkalis, acids or cleaning agents for example.

The present invention advantageously creates for the first time a cooling system for electronics housings covering a number of circuit board levels with a space-saving, compact design. It is especially suitable for applications in the automotive area.

Further advantages and embodiments of the invention will be explained below on the basis of an exemplary embodiment as well as with reference to the drawing.

The figures show the following schematic diagrams:

DESCRIPTION OF THE INVENTION

Figure 1:
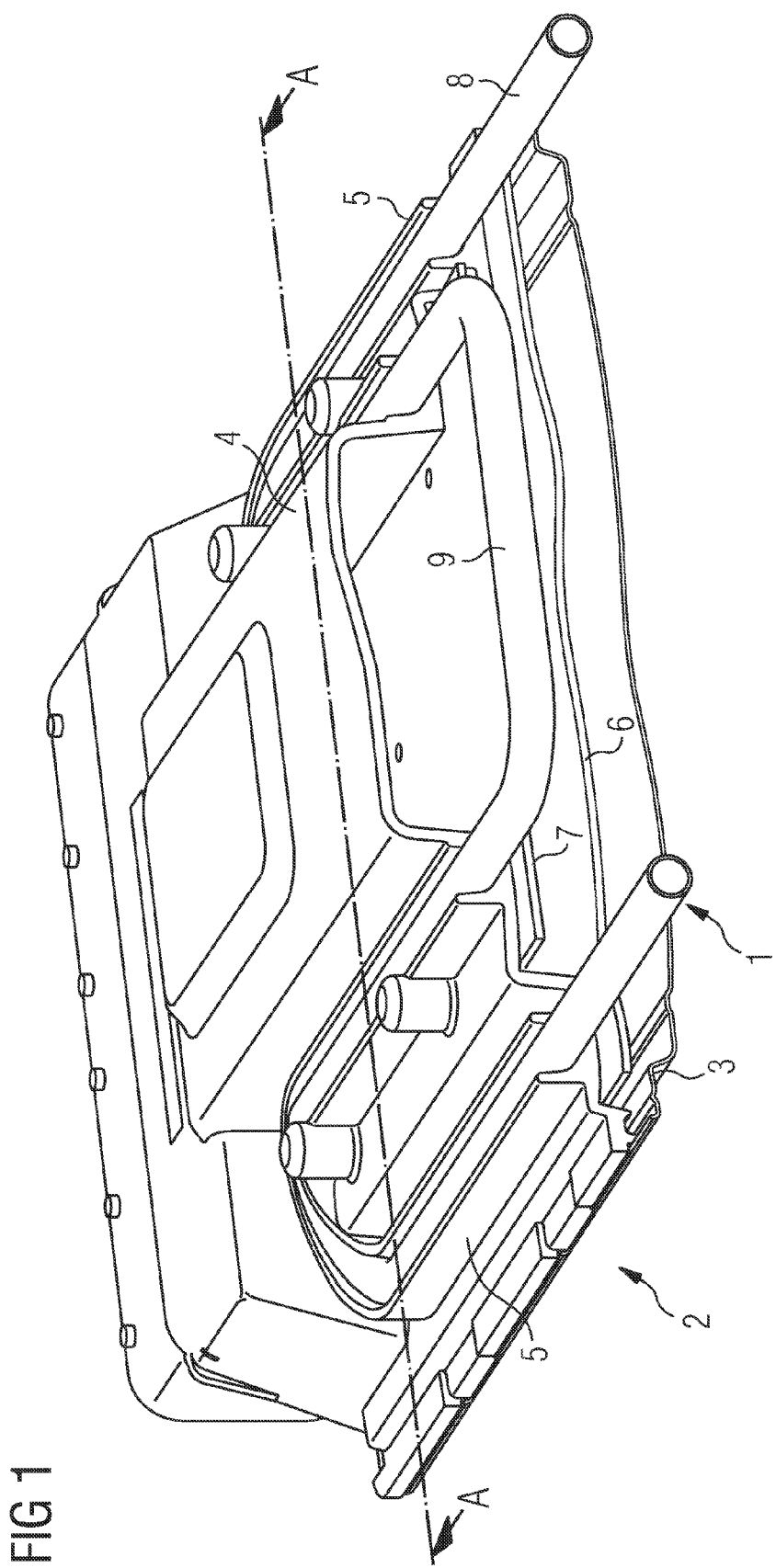
FIG. 1 a perspective diagram of an inventive cooling system.

FIG. 1 shows a perspective view of an inventive cooling system 1 for electronics housings in the assembled state. The electronics housing 2 depicted in FIG. 1 comprises a lower housing part 3 as well as an upper housing part 4, on which the cooling system 1 is supported, preferably in symmetrically arranged U-shaped guide slots 5. In this case the limbs of the U-shaped guide slot 5 are not at the same level but at the same position as the circuit board levels 6 and 7 supported within the electronics housing 2. A total of three levels are produced. Level 1 comprises the space between lower housing part 3 and circuit board level 6. Level 2 comprises the space between the circuit board levels 6 and 7. The third level is delimited by the printed circuit board level 7 and the upper part of the housing 4. The cooling system 1, which is preferably embodied by a serpentine cooling tube 8, rests outside the housing 2, i.e. on the side of the housing facing away from the printed circuit boards (6, 7) in the U-shaped guide slots 5 arranged symmetrically from the housing center point on levels 2 and 3, which are connected to each other by a transition area 9 on level 3. The inventive cooling system 1 is thus positioned in the immediate vicinity of the printed circuit board levels 6 and 7. The serpentine cooling tube 8 is preferably embodied in one piece and made from a heat-conducting and corrosion-resistant material. The cooling tube 8 preferably has a diameter of 4 to 20 mm, especially of 8 to 18 mm.

Figure 2:
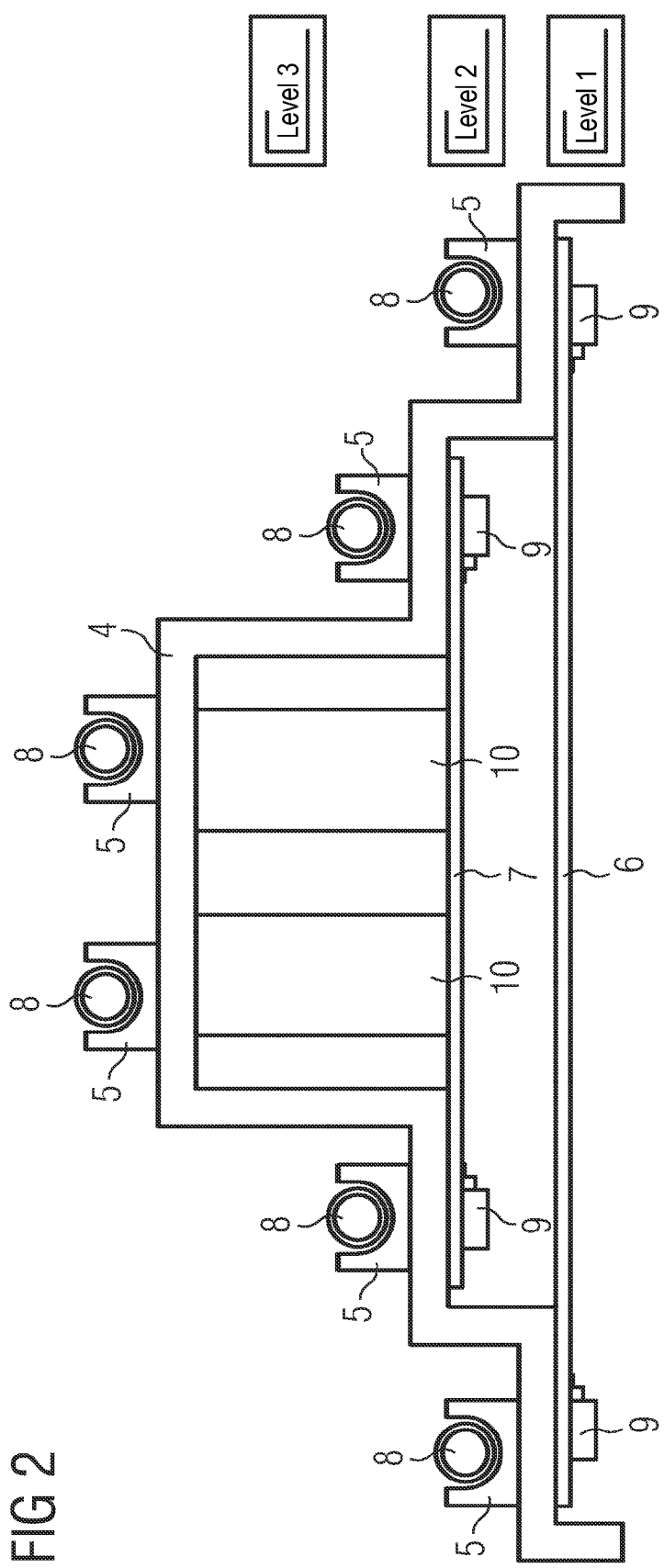
FIG. 2 the inventive cooling system depicted in FIG. 1 in a cross-sectional diagram.

FIG. 2 shows the inventive cooling system 1 in a cross-sectional diagram on the three levels of the electronics housing 2. The electronics housing is equipped with high-power components such as semiconductor elements 9 or capacitors 10 for example. The semiconductor components 9 are arranged in each case below the circuit board level 6 or 7 and directly under the cooling tube located in the guide slot 8. The printed circuit board levels 6 and 7 are partly broken through in the area of the semiconductor components 9, to guarantee a continuous dissipation of heat of the heating-up semiconductor components. The capacitors 10 are located at level 3 and rest on the circuit board levels 7. These components are cooled by a cooling tube 8 through which liquid flows, which is supported both above the upper part of the housing 4 and also to the side on level 2, with cool water of the engine circulation preferably being used as the coolant. Any other medium can be used however, provided a corresponding coolant circulation is established or the inventive cooling system is used in another environment, i.e. not in the motor vehicle.

The present invention advantageously for the first time creates a cooling system for electronics housings covering a number of circuit board levels with a space-saving, compact design. It is especially suitable for applications in the automotive area.

The invention claimed is:

1. A cooling system assembly for removing waste heat from an electronics housing, comprising:
   a liquid-conducting cooling system for removing waste heat from the electronics housing;
   wherein said cooling system is adapted to a geometry of the electronics housing and said cooling system is disposed outside of said electronics housing.

2. The cooling system assembly according to claim 1, wherein the electronics housing is a housing for an electronic component of a motor vehicle.

3. The cooling system according to claim 1, wherein the electronics housing contains at least two printed circuit boards disposed at mutually different levels, and said cooling system is disposed on a plurality of circuit board levels.

4. The cooling system according to claim 1, wherein said cooling system is a serpentine cooling tube following a meandering course.

5. The cooling system according to claim 1, wherein said cooling system is formed in one piece.

6. The cooling system according to claim 1, wherein the electronics housing contains a plurality of printed circuit boards.

7. The cooling system according to claim 1, wherein said cooling system is formed of a heat-conducting material.

8. The cooling system according to claim 7, wherein said cooling system is formed of aluminum.

9. The cooling system according to claim 1, wherein the housing is formed with a guide slot and said the cooling system is supported in the guide slot.

10. The cooling system according to claim 1, wherein said cooling system has a pipe with a pipe diameter of 4 to 20 mm.

11. The cooling system according to claim 10, wherein said pipe has a pipe diameter of 8 to 18 mm.

12. The cooling system according to claim 10, wherein said pipe is a serpentine cooling tube following a meandering course.

13. The cooling system according to claim 12, wherein the electronics housing contains at least two printed circuit boards disposed at mutually different levels, and said cooling tube extends over a plurality of circuit board levels.

14. The cooling system according to claim 1, wherein said cooling system is formed of a corrosion-resistant material.

15. The cooling system assembly according to claim 1, in combination with said electronics housing, further comprising:
    at least one printed circuit board disposed inside said electronics housing;
    said cooling system including a conduit being disposed outside of said electronics housing and on said electronics housing.

16. The combination according to claim 15, wherein said conduit is a tube.

17. The cooling system according to claim 1, wherein said cooling system is disposed on an outer surface of said electronics housing.

18. A cooling system assembly for removing waste heat from an electronics housing, comprising:
    a liquid-conducting cooling system for removing waste heat from the electronics housing;
    wherein said cooling system is adapted to a geometry of the electronics housing and said cooling system is disposed outside of said electronics housing; and
    wherein the electronics housing contains at least two printed circuit boards disposed at mutually different levels, and said cooling system is disposed on a plurality of circuit board levels.

* * * * *